(12) United States Patent
Bathan et al.

(10) Patent No.: US 8,110,440 B2
(45) Date of Patent: Feb. 7, 2012

(54) SEMICONDUCTOR DEVICE AND METHOD OF FORMING OVERLAPPING SEMICONDUCTOR DIE WITH COPLANAR VERTICAL INTERCONNECT STRUCTURE

(75) Inventors: Henry D. Bathan, Singapore (SG); Zigmund R. Camacho, Singapore (SG); Jairus L. Pisigan, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 248 days.

(21) Appl. No.: 12/467,865

(22) Filed: May 18, 2009

(65) Prior Publication Data

US 2010/0289131 A1    Nov. 18, 2010

(51) Int. Cl.
*H01L 25/00* (2006.01)
*H01L 23/488* (2006.01)

(52) U.S. Cl. . 438/109; 438/121; 257/686; 257/E21.508; 257/E25.013; 257/E23.06

(58) Field of Classification Search .......... 438/109, 438/121; 257/686, E25.013
See application file for complete search history.

(56) References Cited

U.S. PATENT DOCUMENTS

| | | | |
|---|---|---|---|
| 6,252,300 B1 * | 6/2001 | Hsuan et al. | 257/686 |
| 6,396,116 B1 * | 5/2002 | Kelly et al. | 257/432 |
| 6,476,474 B1 * | 11/2002 | Hung | 257/686 |
| 6,707,684 B1 * | 3/2004 | Andric et al. | 361/785 |
| 6,737,736 B2 * | 5/2004 | Abe et al. | 257/676 |
| 6,740,980 B2 * | 5/2004 | Hirose | 257/777 |
| 6,906,415 B2 * | 6/2005 | Jiang et al. | 257/723 |
| 6,965,154 B2 * | 11/2005 | Abe et al. | 257/506 |
| 7,061,087 B2 * | 6/2006 | Kim | 257/686 |
| 7,109,583 B2 * | 9/2006 | Johnson | 257/734 |
| 7,122,906 B2 * | 10/2006 | Doan | 257/778 |
| 7,312,529 B2 | 12/2007 | Clevenger et al. | |
| 2002/0105061 A1 * | 8/2002 | Abe et al. | 257/666 |
| 2004/0090759 A1 * | 5/2004 | Kim | 361/790 |
| 2004/0124520 A1 * | 7/2004 | Rinne | 257/686 |
| 2005/0248031 A1 * | 11/2005 | Johnson | 257/737 |
| 2007/0158809 A1 * | 7/2007 | Chow et al. | 257/686 |
| 2008/0150157 A1 | 6/2008 | Nishimura et al. | |

* cited by examiner

*Primary Examiner* — N Drew Richards
*Assistant Examiner* — Robert Carpenter
(74) *Attorney, Agent, or Firm* — Robert D. Atkins; Patent Law Group: Atkins & Assoiciates, P.C.

(57) ABSTRACT

A semiconductor device is made by forming first and interconnect structures over a first semiconductor die. A third interconnect structure is formed in proximity to the first die. A second semiconductor die is mounted over the second and third interconnect structures. An encapsulant is deposited over the first and second die and first, second, and third interconnect structures. A backside of the second die is substantially coplanar with the first interconnect structure and a backside of the first semiconductor die is substantially coplanar with the third interconnect structure. The first interconnect structure has a height which is substantially the same as a combination of a height of the second interconnect structure and a thickness of the second die. The third interconnect structure has a height which is substantially the same as a combination of a height of the second interconnect structure and a thickness of the first die.

31 Claims, 4 Drawing Sheets

SEMICONDUCTOR DEVICE AND METHOD OF FORMING OVERLAPPING SEMICONDUCTOR DIE WITH COPLANAR VERTICAL INTERCONNECT STRUCTURE

FIELD OF THE INVENTION

The present invention relates in general to semiconductor devices and, more particularly, to a semiconductor device and method of forming overlapping semiconductor die with a coplanar vertical interconnect structure for stacking semiconductor devices.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

The electrical interconnection between a wafer level chip scale package (WLCSP), package-on-package (PoP), and internal stacking module (ISM) containing semiconductor devices on multiple levels and external devices can be accomplished with conductive through silicon vias (TSV), through hole vias (THV), or conductive pillars. In most TSVs and THVs, the sidewalls and bottom-side of the via are conformally plated with conductive materials to enhance adhesion. The TSVs and THVs are then filled with another conductive material, for example, by copper deposition through an electroplating process. The formation of TSVs and THVs and integration of stacked packages through the vertical interconnect structure is a costly part of the manufacturing process, which creates issues for highly competitive markets such as memory and application specific integrated circuits (ASIC).

SUMMARY OF THE INVENTION

A need exists to provide an interconnect structure for vertical integration of semiconductor packages using a simple, low-cost manufacturing process. Accordingly, in one embodiment, the present invention is a method of making a semiconductor device comprising the steps of providing a sacrificial carrier, forming a first conductive layer over the sacrificial carrier, mounting a backside of a first semiconductor die over the first conductive layer, forming a first solder bump over a first contact pad of the first semiconductor die, forming a second solder bump over a second contact pad of the first semiconductor die, forming a third solder bump over the sacrificial carrier in proximity to the first semiconductor die, mounting first and second contact pads of a second semiconductor die over the second and third solder bumps, forming a second conductive layer over a backside of the second semiconductor die opposite the first and second contact pads of the second semiconductor die, depositing an encapsulant over the first and second semiconductor die and first, second, and third solder bumps, removing the sacrificial carrier, and removing a portion of the encapsulant to planarize the first solder bump and the backside of the second semiconductor die and planarize the third solder bump and the backside of the first semiconductor die.

In another embodiment, the present invention is a method of making a semiconductor device comprising the steps of providing a first semiconductor component, forming first and second interconnect structures over the first semiconductor component, forming a third interconnect structure in proximity to the first semiconductor component, and mounting a second semiconductor component over the second and third interconnect structures. A backside of the second semiconductor die opposite the second and third interconnect structures is substantially coplanar with the first interconnect structure. A backside of the first semiconductor component opposite the first and second interconnect structures is substantially coplanar with the third interconnect structure.

In another embodiment, the present invention is a method of making a semiconductor device comprising the steps of providing a first semiconductor component, forming first and second interconnect structures over the first semiconductor component, forming a third interconnect structure in proximity to the first semiconductor component, and mounting a second semiconductor component over the second and third interconnect structures. The first interconnect structure has a height which is substantially the same as a combination of a height of the second interconnect structure and a thickness of the second semiconductor component. The third interconnect structure has a height which is substantially the same as a combination of a height of the second interconnect structure and a thickness of the first semiconductor component.

In another embodiment, the present invention is a semiconductor device comprising a first semiconductor component and first and second interconnect structures formed over the first semiconductor component. A third interconnect structure is formed in proximity to the first semiconductor component. A second semiconductor component is mounted over the second and third interconnect structures. A backside of the second semiconductor die opposite the second and third interconnect structures is substantially coplanar with the first interconnect structure. A backside of the first semiconductor component opposite the first and second interconnect structures is substantially coplanar with the third interconnect structure.

DETAILED DESCRIPTION OF THE DRAWINGS

Figure 1:
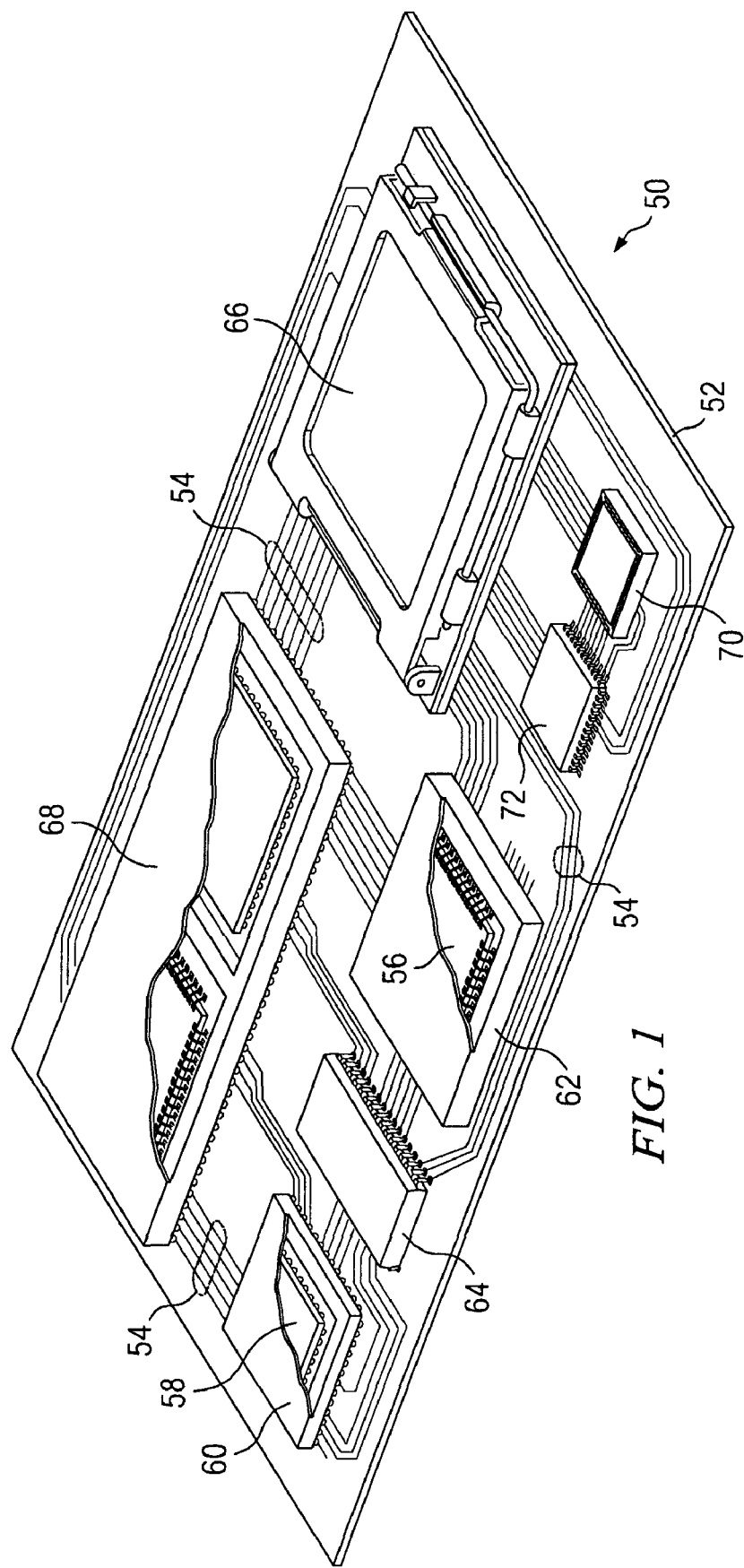
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or PCB 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a sub-component of a larger system. For example, electronic device 50 may be a graphics card, network interface card, or other signal processing card that can be inserted into a computer. The semiconductor package can include microprocessors, memories, application specific integrated circuits (ASICs), logic circuits, analog circuits, RF circuits, discrete devices, or other semiconductor die or electrical components.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
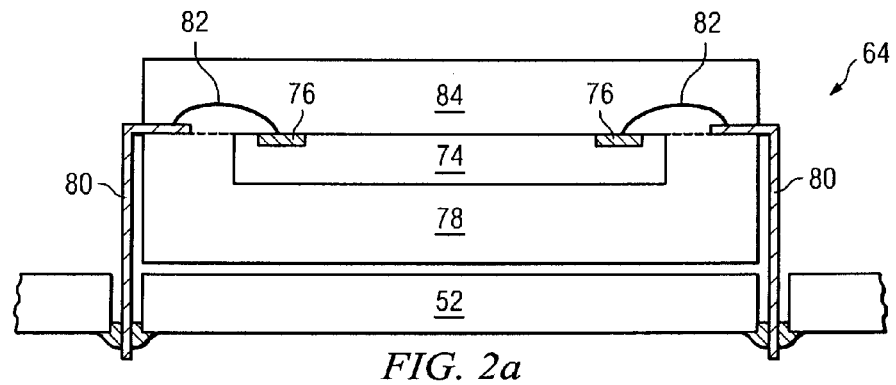
FIGS. 2a-2c illustrate further detail of the representative semiconductor packages mounted to the PCB.
Figure 2B:
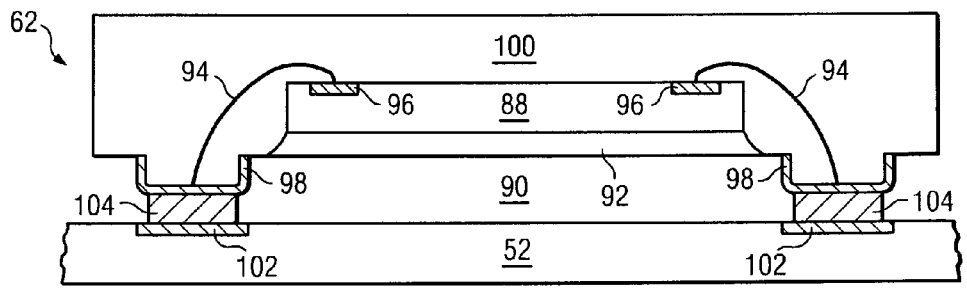
Figure 2C:
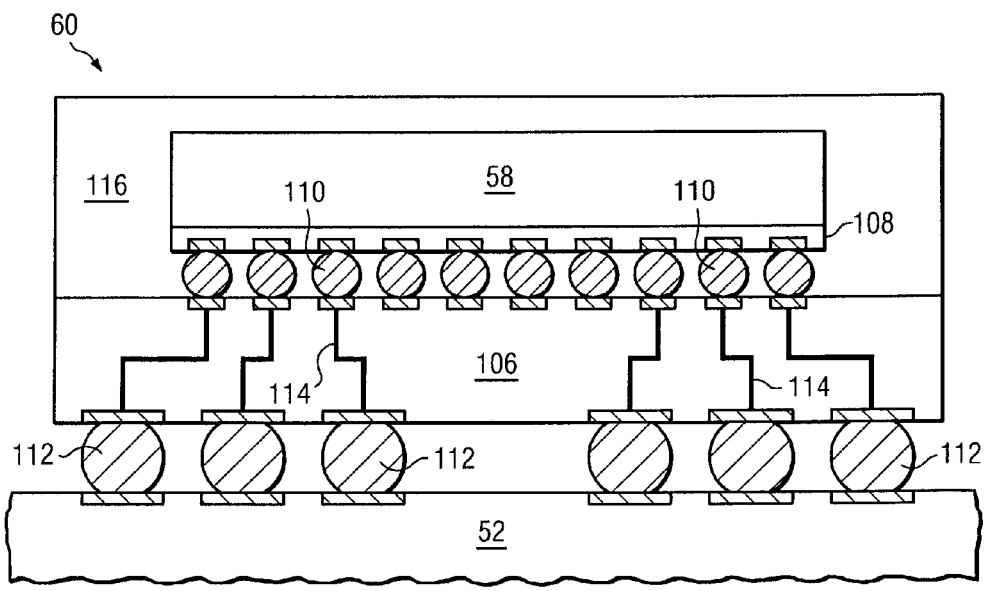

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 2b illustrates further detail of BCC 62 mounted on PCB 52. Semiconductor die 88 is mounted over carrier 90 using an underfill or epoxy-resin adhesive material 92. Wire bonds 94 provide first level packing interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition such electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3A:
FIGS. 3a-3e illustrate a process of forming overlapping die with a coplanar vertical interconnect structure.
Figure 3B:
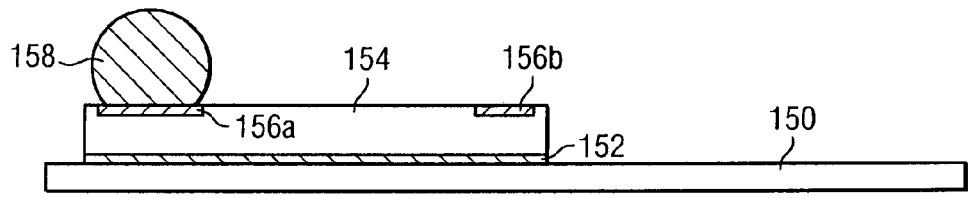

FIGS. 3a-3e illustrate a process of forming a coplanar vertical (z-direction) interconnect structure for a wafer level chip scale package (WLCSP). In FIG. 3a, a sacrificial substrate or carrier 150 contains dummy or sacrificial base material such as silicon, polymer, polymer composite, metal, ceramic, glass, glass epoxy, beryllium oxide, or other suitable low-cost, rigid material or bulk semiconductor material for structural support. In one embodiment, carrier 150 is tape with a stiffener frame.

An electrically conductive layer 152 is formed over carrier 150 using patterning with PVD, CVD, sputtering, electrolytic plating, electroless plating process, or other suitable metal deposition process. Conductive layer 152 can be one or more layers of Al, Cu, Sn, Ni, Au, Ag, Au—Ni, or other suitable electrically conductive material.

A backside of semiconductor die 154 is disposed over conductive layer 152 with contact pads 156a-156b oriented upward. Alternatively, conductive layer 152 is formed over a backside of semiconductor die 154 before mounting to carrier 150. Semiconductor die 154 includes a substrate with an active region containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within its active surface to implement baseband analog circuits or digital circuits, such as digital signal processor (DSP), ASIC, memory, or other signal processing circuit. Semiconductor die 154 may also contain IPD, such as inductors, capacitors, and resistors, for RF signal processing. In another embodiment, a discrete component can be mounted on conductive layer 152 over carrier 150.

An electrically conductive material is deposited over contact pad 156a using an evaporation, electrolytic plating, electroless plating, ball drop, or screen printing process. The conductive material can be Al, Sn, Ni, Au, Ag, Pb, Bi, Cu, solder, and combinations thereof, with an optional flux material. For example, the conductive material can be eutectic Sn/Pb, high-lead solder, or lead-free solder. The conductive material is bonded to contact pad 156a using a suitable attachment or bonding process. In one embodiment, the conductive material is reflowed by heating the material above its melting point to form spherical balls or bumps 158. In some applications, bumps 158 are reflowed a second time to improve electrical connection to contact pad 156a. The bumps can also be compression bonded to contact pad 156a. Bumps 158 represent one type of vertical, z-direction interconnect structure that can be formed over contact pad 156a. The interconnect structure can also use bond wires, conductive paste, stud bump, micro bump, or other electrical interconnect.

Figure 3C:
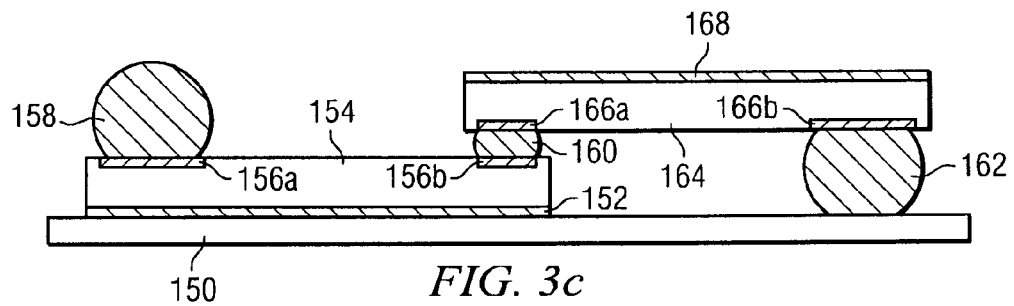

In FIG. 3c, an electrically conductive material is deposited over contact pad 156b and over carrier 150 in proximity to (within one die width) semiconductor die 154 using an evaporation, electrolytic plating, electroless plating, ball drop, or screen printing process. The conductive material can be Al, Sn, Ni, Au, Ag, Pb, Bi, Cu, solder, and combinations thereof, with an optional flux material. For example, the conductive material can be eutectic Sn/Pb, high-lead solder, or lead-free solder. The conductive material is bonded to contact pad 156b and over carrier 150 using a suitable attachment or bonding process. In one embodiment, the conductive material is reflowed by heating the material above its melting point to form spherical ball or bump 160 and spherical ball or bump 162. The bumps can also be compression bonded. Bumps 160-162 represent one type of vertical, z-direction interconnect structure that can be formed over contact pad 156b and over carrier 150. The interconnect structure can also use bond wires, conductive paste, stud bump, micro bump, or other electrical interconnect.

A semiconductor die 164 is mounted over semiconductor die 154 with contact pads 166a-166b oriented downward. Contact pads 166a-166b electrically connect to solder bumps 160 and 162, respectively. Semiconductor die 164 overlaps semiconductor die 154 by at least the area of contact pads 156b and 166a. Semiconductor die 164 includes a substrate with an active region containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within its active surface to implement baseband analog circuits or digital circuits, such as DSP, ASIC, memory, or other signal processing circuit. Semiconductor die 164 may also contain IPD, such as inductors, capacitors, and resistors, for RF signal processing. In another embodiment, a discrete component can be mounted over solder bumps 160 and 162.

A conductive layer 168 is formed over a backside of semiconductor die 164, opposite contact pads 166a-166b, using patterning with PVD, CVD, sputtering, electrolytic plating, electroless plating process, or other suitable metal deposition process. Conductive layer 168 can be one or more layers of Al, Cu, Sn, Ni, Au, Ag, Au—Ni, or other suitable electrically conductive material.

Figure 3D:
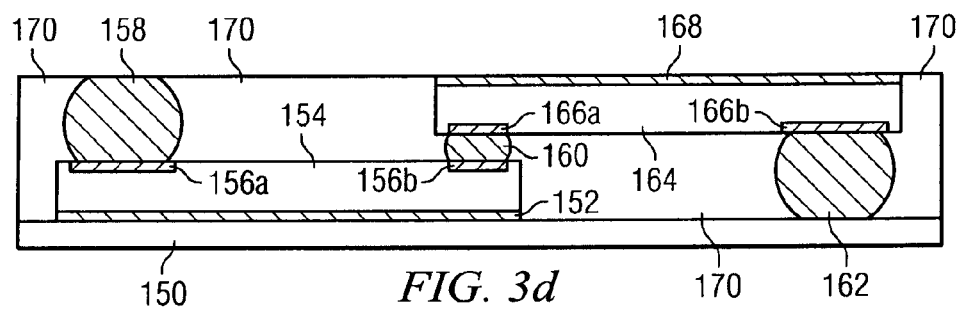

FIG. 3d shows an encapsulant or molding compound 170 deposited over carrier 150, semiconductor die 154 and 164, and around solder bumps 158, 160, and 162 using a paste printing, compressive molding, transfer molding, liquid encapsulant molding, vacuum lamination, or other suitable applicator. Encapsulant 170 can be polymer composite material, such as epoxy resin with filler, epoxy acrylate with filler, or polymer with proper filler. Encapsulant 170 is non-conductive and environmentally protects the semiconductor device from external elements and contaminants. Die attach adhesive is not required for semiconductor die 154 and 164.

Figure 3E:
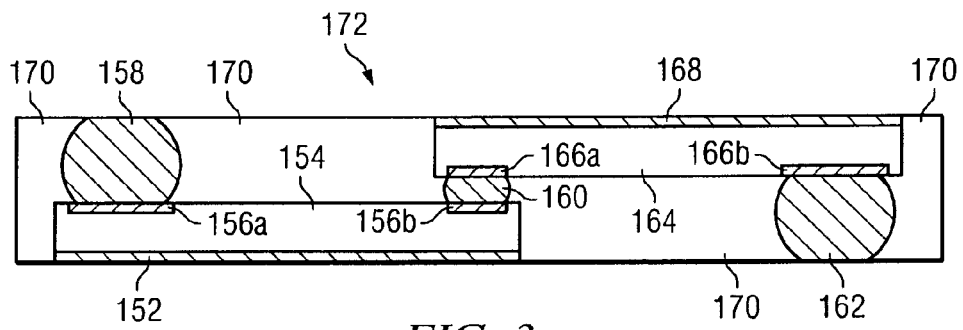

In FIG. 3e, carrier 150 is removed by chemical etching, mechanical peel-off, CMP, mechanical grinding, thermal bake, laser scanning, or wet stripping. A portion of encapsulant 170 is removed by an etching process to expose solder bumps 158 and 162 and planarize solder bump 158 to the backside of semiconductor die 164, including conductive layer 168, and planarize solder bump 162 to the backside of semiconductor die 154, including conductive layer 152. The height of solder bump 158 is made substantially the same as the combination of the height of solder bump 160 and thickness of semiconductor die 164. Likewise, the height of solder bump 162 is made substantially the same as the combination of the height of solder bump 160 and thickness of semiconductor die 154. Accordingly, in semiconductor device 172, the exposed portion of solder bump 158 is substantially coplanar with the backside of semiconductor die 164, including conductive layer 168. On the opposite surface of semiconductor device 172, the exposed portion of solder bump 162 is substantially coplanar with the backside of semiconductor die 154, including conductive layer 152. The coplanarity of the opposite surfaces of semiconductor device 172, including the z-direction interconnect structure 158, 160, and 162, are suitable for stacking a plurality of semiconductor devices 172.

Semiconductor die 154 and 164 are flip chip type semiconductor die. Since semiconductor die 154 and 164 overlap and share common solder bump 160, the width of semiconductor device 172 is reduced as compared to two side-by-side semiconductor die.

Figure 4:
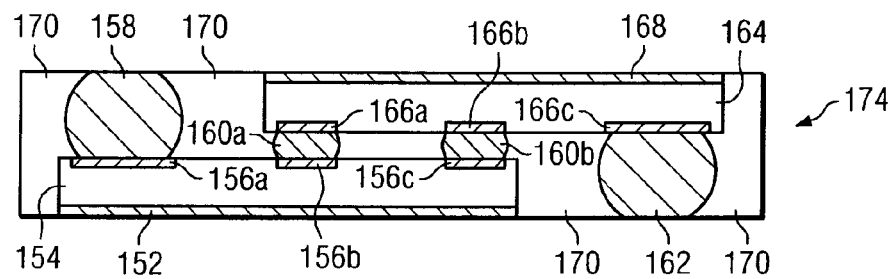
FIG. 4 illustrates the overlapping die with multiple rows of solder bumps within the overlapping region.

FIG. 4 shows an embodiment with a plurality of rows of solder bumps 160 electrically connecting semiconductor die 154 and 164. Solder bump 160a is disposed between contact pads 156b and 166a, and solder bump 160b is disposed between contact pads 156c and 166b. In this embodiment, semiconductor die 154 and 164 overlap by at least the area needed for the multiple rows of solder bumps 160.

Figure 5:
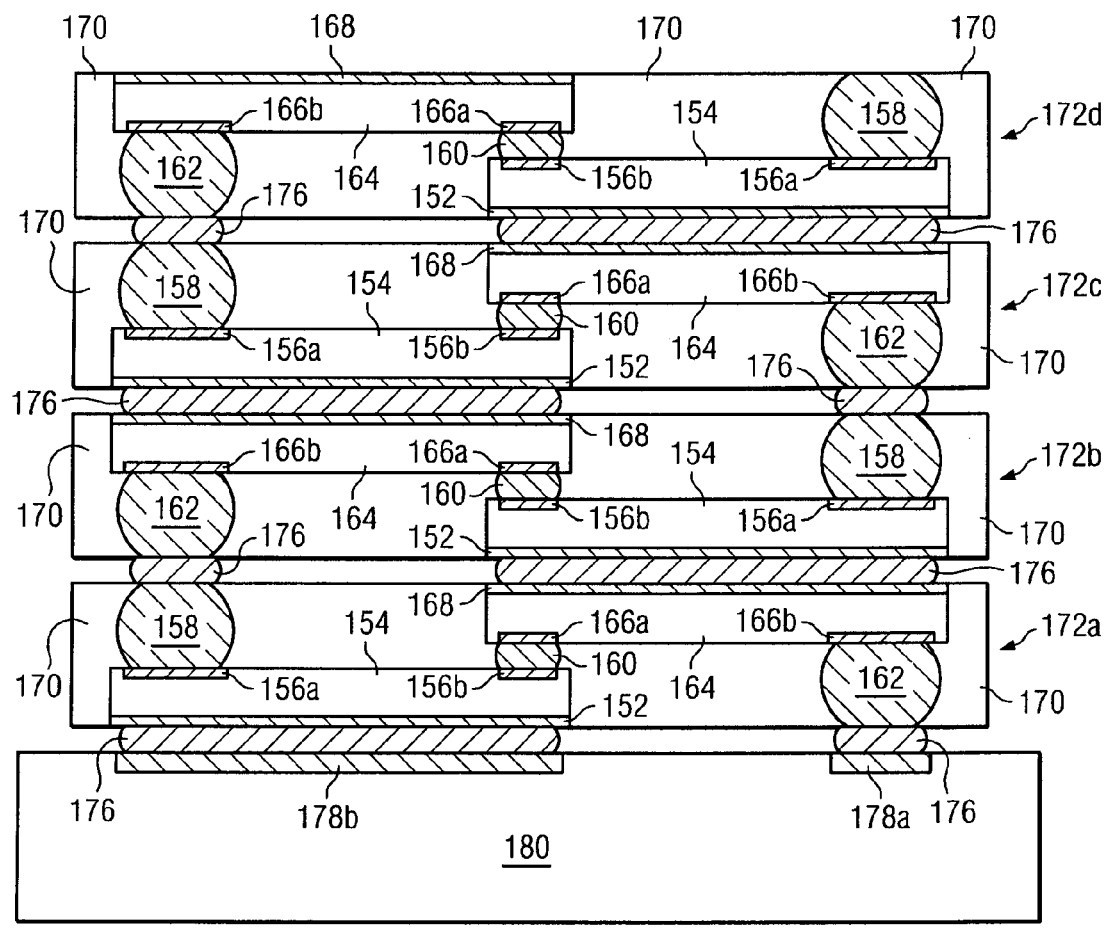
FIG. 5 illustrates stacked semiconductor devices electrically connected through the coplanar vertical interconnect structure.

FIG. 5 shows a plurality of semiconductor devices 172a-172d vertically stacked over PCB 180. Solder bump 162 of semiconductor device 172a is electrically connected to interconnect site 178a of PCB 180 using solder paste 176. Conductive layer 152 of semiconductor device 172a is electrically connected to interconnect site 178b of PCB 180. Solder bump 158 of semiconductor device 172a is electrically connected to solder bump 162 of semiconductor device 172b using solder paste 176. Conductive layer 168 of the semiconductor device 172a is electrically connected to conductive layer 152 of the semiconductor device 172b using solder paste 176. Solder bump 158 of semiconductor device 172b is electrically connected to solder bump 162 of semiconductor device 172c using solder paste 176. Conductive layer 168 of the semiconductor device 172b is electrically connected to conductive layer 152 of the semiconductor device 172c using solder paste 176. Solder bump 158 of semiconductor device 172c is electrically connected to solder bump 162 of semiconductor device 172d using solder paste 176. Conductive layer 168 of the semiconductor device 172c is electrically connected to conductive layer 152 of the semiconductor device 172d using solder paste 176.

The above described stacking technique for semiconductor device 172 containing overlapping semiconductor die 154 and 164 with coplanar interconnect structure is suitable for WLCSP, package-on-package (PoP), and internal stacking module (ISM). In particular, the device stacking is suitable for memory devices and application specific integrated circuits (ASIC) because of the low profile package thickness and low manufacturing cost.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a sacrificial carrier;
    forming a first conductive layer over the sacrificial carrier;
    mounting a backside of a first semiconductor die over the first conductive layer;
    forming a first conductive bump over a first contact pad of the first semiconductor die;
    forming a second conductive bump over a second contact pad of the first semiconductor die;
    forming a third conductive bump over the sacrificial carrier in proximity to the first semiconductor die;
    mounting first and second contact pads of a second semiconductor die over the second and third conductive bumps;
    forming a second conductive layer over a backside of the second semiconductor die opposite the first and second contact pads of the second semiconductor die;
    depositing an encapsulant over the first and second semiconductor die and first, second, and third conductive bumps;
    removing the sacrificial carrier; and
    removing a portion of the encapsulant to planarize the first conductive bump and the backside of the second semiconductor die and planarize the third conductive bump and the backside of the first semiconductor die.

2. The method of claim 1, wherein the first conductive bump has a height which is substantially the same as a combination of a height of the second conductive bump and a thickness of the second semiconductor die, and the third conductive bump has a height which is substantially the same as a combination of a height of the second conductive bump and a thickness of the first semiconductor die.

3. The method of claim 1, further including:
    stacking a plurality of the semiconductor devices; and
    electrically connecting the semiconductor devices through the first and third conductive bumps and first and second conductive layers.

4. The method of claim 1, wherein the first and second semiconductor die have an overlapping region.

5. The method of claim 4, further including forming a plurality of rows of the second conductive bumps between the overlap region of the first and second semiconductor die.

6. A method of making a semiconductor device, comprising:
    providing a first semiconductor component;
    forming first and second conductive interconnect structures over the first semiconductor component;
    forming a third conductive interconnect structure in proximity to the first semiconductor component; and
    mounting a second semiconductor component over the second and third conductive interconnect structures, wherein a backside of the second semiconductor component opposite the second and third conductive interconnect structures is substantially coplanar with the first conductive interconnect structure, and a backside of the first semiconductor component opposite the first and second conductive interconnect structures is substantially coplanar with the third conductive interconnect structure.

7. A method of making a semiconductor device, comprising:
    providing a first semiconductor component;
    forming first and second interconnect structures over the first semiconductor component;
    forming a third interconnect structure in proximity to the first semiconductor component;
    mounting a second semiconductor component over the second and third interconnect structures, wherein a backside of the second semiconductor component opposite the second and third interconnect structures is substantially coplanar with the first interconnect structure, and a backside of the first semiconductor component opposite the first and second interconnect structures is substantially coplanar with the third interconnect structure;
    depositing an encapsulant over the first and second semiconductor components and first, second, and third interconnect structures; and
    removing a portion of the encapsulant to planarize the first interconnect structure and the backside of the second semiconductor component and planarize the third interconnect structure and the backside of the first semiconductor component.

8. The method of claim 6, wherein the conductive interconnect structure includes a solder bump, conductive pillars, stud bump, or micro bump.

9. The method of claim 6, further including:
    forming a first conductive layer over the backside of the first semiconductor component; and
    forming a second conductive layer over the backside of the second semiconductor component.

10. The method of claim 6, wherein the first and second semiconductor components have an overlapping region.

11. The method of claim 10, further including forming a plurality of rows of the second conductive interconnect structure between the overlap region of the first and second semiconductor components.

12. The method of claim 6, wherein the first conductive interconnect structure has a height which is substantially the same as a combination of a height of the second conductive interconnect structure and a thickness of the second semiconductor component, and the third conductive interconnect structure has a height which is substantially the same as a combination of a height of the second conductive interconnect structure and a thickness of the first semiconductor component.

13. The method of claim 6, further including:
stacking a plurality of the semiconductor devices; and
electrically connecting the semiconductor devices through the first and third conductive interconnect structures.

14. A method of making a semiconductor device, comprising:
providing a first semiconductor component;
forming first and second conductive interconnect structures over the first semiconductor component;
forming a third conductive interconnect structure in proximity to the first semiconductor component; and
mounting a second semiconductor component over the second and third conductive interconnect structures, wherein the first conductive interconnect structure has a height which is substantially the same as a combination of a height of the second conductive interconnect structure and a thickness of the second semiconductor component, and the third conductive interconnect structure has a height which is substantially the same as a combination of a height of the second conductive interconnect structure and a thickness of the first semiconductor component.

15. A method of making a semiconductor device, comprising:
providing a first semiconductor component;
forming first and second interconnect structures over the first semiconductor component;
forming a third interconnect structure in proximity to the first semiconductor component;
mounting a second semiconductor component over the second and third interconnect structures, wherein the first interconnect structure has a height which is substantially the same as a combination of a height of the second interconnect structure and a thickness of the second semiconductor component, and the third interconnect structure has a height which is substantially the same as a combination of a height of the second interconnect structure and a thickness of the first semiconductor component;
depositing an encapsulant over the first and second semiconductor components and first, second, and third interconnect structures; and
removing a portion of the encapsulant to planarize the first interconnect structure and the backside of the second semiconductor component and planarize the third interconnect structure and the backside of the first semiconductor component.

16. The method of claim 14, wherein the conductive interconnect structure includes a solder bump, conductive pillars, stud bump, or micro bump.

17. The method of claim 14, further including forming a first conductive layer over a backside of the first semiconductor component opposite the first and second conductive interconnect structures.

18. The method of claim 17, further including forming a second conductive layer over a backside of the second semiconductor component opposite the second and third conductive interconnect structures.

19. The method of claim 14, further including:
stacking a plurality of the semiconductor devices; and
electrically connecting the semiconductor devices through the first and third conductive interconnect structures.

20. A method of making a semiconductor device, comprising:
providing a carrier;
mounting a first semiconductor component to the carrier;
providing a first conductive structure over the first semiconductor component;
mounting a second semiconductor component over the first semiconductor component using second and third conductive structures, the second conductive structure disposed between the first semiconductor component and the second semiconductor component, the third conductive structure disposed between the carrier and the second semiconductor component;
depositing an encapsulant over the first and second semiconductor components and first, second, and third conductive structures; and
removing a portion of the encapsulant to planarize the first conductive structure and a backside of the second semiconductor component and to planarize the third conductive structure and a backside of the first semiconductor component.

21. The method of claim 20, wherein the first conductive structure has a height that is substantially the same as a combination of a height of the second conductive structure and a thickness of the second semiconductor component, and the third conductive structure has a height that is substantially the same as a combination of a height of the second conductive structure and a thickness of the first semiconductor component.

22. The method of claim 20, wherein the conductive structure comprises a conductive pillar.

23. The method of claim 20, further comprising forming a first conductive layer over the backside of the first semiconductor component opposite the first and second conductive structures.

24. The method of claim 20, further comprising forming a second conductive layer over the backside of the second semiconductor component opposite the second and third conductive structures.

25. The method of claim 20, further comprising:
stacking a plurality of the semiconductor devices; and
electrically connecting the semiconductor devices through the first and third conductive structures.

26. A method making a semiconductor device, comprising:
providing a carrier;
mounting a first semiconductor component to the carrier;
providing a first conductive structure over the first semiconductor component;
mounting a second semiconductor component over the first conductive component and over the carrier using a second conductive structure and a third conductive structure, respectively;
depositing an encapsulant over the first and second semiconductor components and first, second, and third conductive structures; and
removing a portion of the encapsulant to planarize the first conductive structure and a backside of the second semiconductor component and to planarize the third conductive structure and a backside of the first semiconductor component.

27. The method of claim 26, wherein the first conductive structure has a height that is substantially the same as a combination of a height of the second conductive structure and a thickness of the second semiconductor component, and the third conductive structure has a height that is substantially the same as a combination of a height of the second conductive structure and a thickness of the first semiconductor component.

28. The method of claim 26, wherein the conductive structure comprises a conductive bump.

29. The method of claim 26, further comprising forming a first conductive layer over the backside of the first semiconductor component opposite the first and second conductive structures.

30. The method of claim 26, further comprising forming a second conductive layer over the backside of the second semiconductor component opposite the second and third conductive structures.

31. The method of claim 26, further comprising:
   stacking a plurality of the semiconductor devices; and
   electrically connecting the semiconductor devices through the first and third conductive structures.

* * * * *